(12) United States Patent
Peng et al.

(10) Patent No.: US 8,719,660 B2
(45) Date of Patent: May 6, 2014

(54) APPARATUS AND METHODS FOR INDICATING THE HEALTH OF REMOVABLE STORAGE DEVICES

(75) Inventors: Yong Peng, Milpitas, CA (US); Ka Ian Yung, Mountain View, CA (US); Xiangyang Miao, Fremont, CA (US); Arjun Hary, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 138 days.

(21) Appl. No.: 13/331,491

(22) Filed: Dec. 20, 2011

(65) Prior Publication Data
US 2013/0159797 A1    Jun. 20, 2013

(51) Int. Cl.
*G11C 29/00* (2006.01)

(52) U.S. Cl.
USPC ............................ 714/763; 714/718; 714/710

(58) Field of Classification Search
USPC ............... 714/758, 799, 47.2, 47.1, 763, 710, 714/718, 752; 360/26, 47, 53; 365/200, 201
See application file for complete search history.

(56) References Cited

U.S. PATENT DOCUMENTS

| | | | |
|---|---|---|---|
| 6,993,618 B2 * | 1/2006 | Chen et al. | 710/305 |
| 6,993,686 B1 * | 1/2006 | Groenendaal et al. | 714/47.2 |
| 7,126,559 B2 | 10/2006 | Su et al. | |
| 7,836,244 B2 * | 11/2010 | Kim et al. | 711/103 |
| 7,861,122 B2 * | 12/2010 | Cornwell et al. | 714/42 |
| 7,913,032 B1 * | 3/2011 | Cornwell et al. | 711/103 |
| 8,022,417 B2 | 9/2011 | Takiar et al. | |
| 8,078,918 B2 * | 12/2011 | Diggs et al. | 714/42 |
| 8,151,020 B2 * | 4/2012 | Merry et al. | 710/56 |
| 8,417,988 B2 * | 4/2013 | Kim et al. | 714/6.11 |
| 2009/0077434 A1 * | 3/2009 | Furuhjelm et al. | 714/710 |
| 2009/0174981 A1 | 7/2009 | Mallon et al. | |
| 2010/0309657 A1 | 12/2010 | Purdy et al. | |

OTHER PUBLICATIONS

U.S. Appl. No. 13/167,929, filed Jun. 24, 2011, Lassa et al.

* cited by examiner

*Primary Examiner* — Albert Decady
*Assistant Examiner* — Osman Alshack
(74) *Attorney, Agent, or Firm* — Weaver Austin Villeneuve & Sampson LLP

(57) ABSTRACT

Disclosed are apparatus and techniques for indicating health of a memory system having a controller and nonvolatile memory array. In one embodiment, the invention pertains to a method for indicating health of a removable memory system that is removably coupled with a host device. After the memory system is coupled with a host device, a first health status is output via an external electrical or mechanical interface of the memory system. One or more health metrics of the memory system are monitored. After a first predefined limit is reached with respect to the one or more health metrics, a second health status is output via the external electrical or mechanical interface of the memory system. The first health status differs from the second health status.

17 Claims, 5 Drawing Sheets

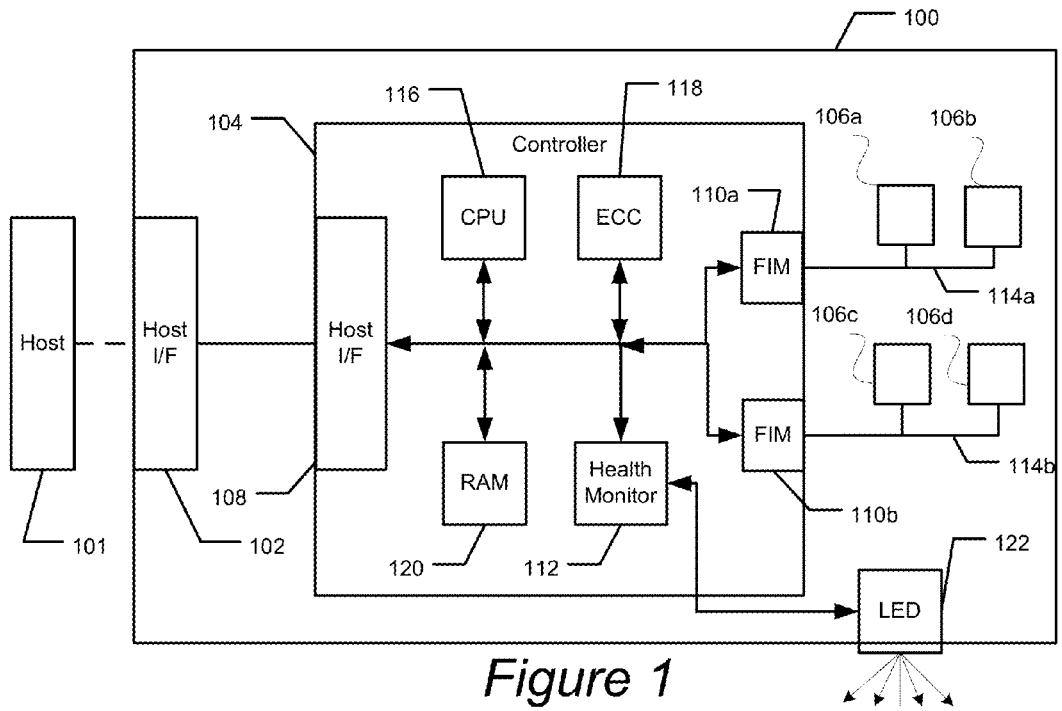

Figure 1

| Mode | LED Behavior | Hot Count Limit (MLC/SLC) | Writable? | Description |
|---|---|---|---|---|
| RW Mode | Breath Slowly | < 6/600 | Yes | Card plugged in |
| Transition | Blinking rapidly | ≥ 6/600 | Yes | Give a warning flag to user that card is close to write cycle threshold. |
| | | ≥ 9/900 | Yes | Will convert to RO with following conditions: 1. Unplug card; or 2. Host idle for 5 seconds |
| | | ≥ 10/1000 | No | Will convert to RO mode immediately |
| RO Mode | Solid on | ≥ 9/900 | No | Card is read only |

Figure 2

APPARATUS AND METHODS FOR INDICATING THE HEALTH OF REMOVABLE STORAGE DEVICES

BACKGROUND OF THE INVENTION

This invention relates to methods and apparatus for indicating the health status of removable memory systems, and in particular to displaying the health status of nonvolatile or flash or EEPROM type memory systems.

The use of non-volatile memory systems, such as flash memory storage systems, is increasing due to the compact physical size of such memory systems, and the ability for non-volatile memory to be repetitively reprogrammed. The compact physical size of flash memory storage systems facilitates the use of such storage systems in devices that are becoming increasingly prevalent. Devices which use flash memory storage systems include, but are not limited to, digital cameras, digital camcorders, digital music players, handheld personal computers, and global positioning devices.

Although non-volatile memory or, more specifically, non-volatile memory storage cells within flash memory systems may be repetitively programmed and erased, each cell or physical location may only be erased a certain number of times before the cell wears out. In some systems, a cell may be erased up to approximately ten thousand times before the cell is considered to be unusable. In other systems, a cell may be erased up to approximately one hundred thousand times or even up to a million times before the cell is considered to be worn out.

As nonvolatile memory is utilized, data is stored in the nonvolatile memory array, and data is also erased prior to use of the same locations, e.g., re-written. In most applications, nonvolatile memory is organized into blocks and when a write is initiated by a host that is coupled to the memory, generally through a controller device, one or more blocks are written at a time. Prior to re-writing the one or more blocks, such blocks are typically erased. When a particular block undergoes a certain threshold number of write and erase operations or cycles, this particular block will generally become defective or its ability to store information deteriorates.

SUMMARY OF THE INVENTION

The present invention is defined by the claims, and nothing in this section should be taken as a limitation on those claims.

In general, apparatus and techniques for indicating health of a memory system having a controller and nonvolatile memory array are provided. In one embodiment, the invention pertains to a method for indicating health of a removable memory system that is removably coupled with a host device. After the memory system is coupled with a host device, a first health status is output via an external electrical or mechanical interface of the memory system. One or more health metrics of the memory system are monitored. After a first predefined limit is reached with respect to the one or more health metrics, a second health status is output via the external electrical or mechanical interface of the memory system. The first health status differs from the second health status.

In a specific implementation, the first health status indicates that the host device is allowed to perform data operations, including programming operations, with respect to the memory system. In a further aspect that can be combined with any combination of the above features, the first predefined limit is a first programming or erase count limit and the second health status indicates that the memory system is close to its maximum programming or erase count limit for allowing programming operations from the host to the memory system to continue. In yet a further aspect that can be combined with any combination of the above features, after a second predefined limit is reached with respect to the one or more health metrics, the memory system is converted to read only mode after the memory system is decoupled from the host device or the host device remains idle for more than a predefined time duration. In another embodiment that can be combined with any combination of the above features, after a third predefined limit is reached with respect to the one or more health metrics, a third health status is output via the external electrical or mechanical interface of the memory system and the memory system is converted to read only mode even if the memory system remains coupled with the host device. In this embodiment, the second predefined limit is a second programming or erase count limit that is higher than the first programming or erase count limit, and the third predefined count limit is a third programming or erase count limit that is higher than the second programming or erase count limit. The third health status differs from the first and second health status, and the third health status indicates that the memory system has reached the end of its programming life. In a further aspect that can be combined with any combination of the above features, the memory system is converted to read only mode after the third predefined limit is reached, even if the host device remains idle for more than a predefined duration of time or the host device is active. In yet a further implementation that can be combined with any combination of the above features, the electrical or mechanical interface is a light device, and the first health status causes the light device to breathe slowly, the second health status causes the light device to blink rapidly, and the third health status causes the light device to remain on.

In another embodiment that can be combined with any combination of the above features, the host device is queried as to whether the memory system is to be converted into read only mode. If the host device indicates that the memory system is not to be converted into read only mode, the memory system is stopped from being converted to read only mode or the memory system is converted back to a programming mode. In a further aspect that can be combined with any combination of the above features, the host device is informed that if the memory system is not to be converted to read only mode, data retention of a predefined maximum time duration cannot be guaranteed.

In another method embodiment that can be combined with any combination of the above features, after the memory system is coupled with a host device, a first externally visible or audible health indicator, which indicates that the memory system is programmable by the host device, is output from the memory system. A hot count for performing an erase cycle on each memory cell block of the memory system is tracked to determine whether the hot count has reached one of a plurality of hot count thresholds. If the hot count reaches a first one of the hot count thresholds, a second externally visible or audible health indicator, which indicates that the memory system is about to be converted to a read only mode, is output from the memory system. If the hot count reaches a second one of the hot count thresholds, a third externally visible or audible health indicator, which indicates that the memory system is being immediately converted to a read only mode, is output from the memory system.

In another the invention pertains to a memory system that is removably couplable with a host device. The memory system comprises an external electrical or mechanical interface coupled with a controller, a nonvolatile memory array for storing data and coupled with the controller, and the controller, which is operable to perform one or more of the above operations.

These and other features of the present invention will be presented in more detail in the following specification of embodiments of the invention and the accompanying figures, which illustrate by way of example the principles of the invention.

BRIEF DESCRIPTION OF THE DRAWINGS

FIG. 1 shows an example of a memory system in accordance with one embodiment of the present invention.

FIG. 2 is a table that illustrates utilization of plurality of health status modes in accordance with one embodiment of the present invention.

DETAILED DESCRIPTION OF SPECIFIC EMBODIMENTS

Figure 3:
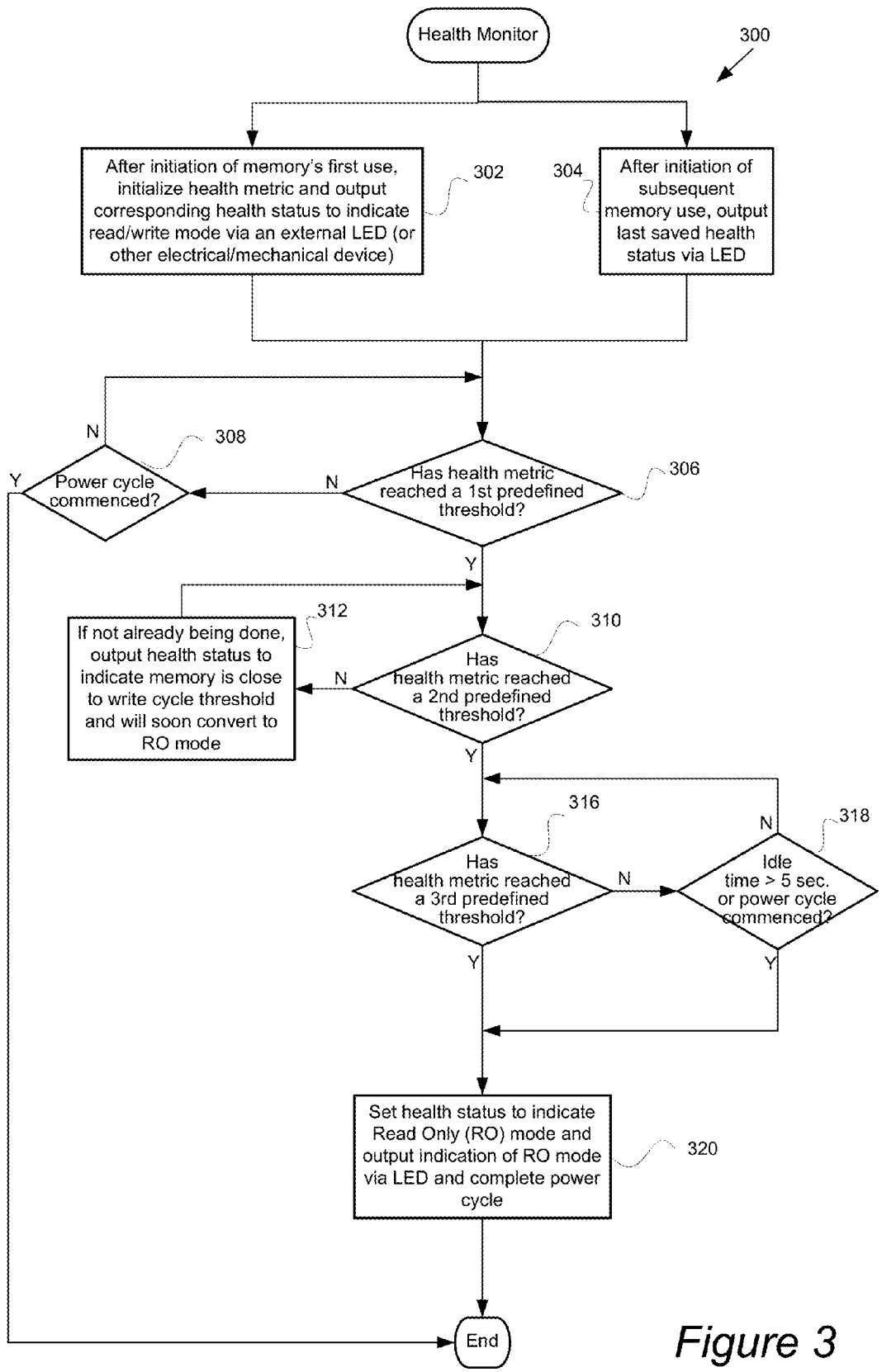
FIG. 3 is a flow chart illustrating a health monitor procedure in accordance with a specific implementation of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The following embodiments are directed to techniques and apparatus for monitoring the health status of a storage system that is removably coupled to a host and notifying the host of such status. In general, the memory storage system may include a health monitor module that is configured to monitor operating parameters that are indicative of health. The health monitor tracks and obtains one or more health metrics from the memory system. For example, the health monitor tracks hot counts or error correction rates of the storage system. The health monitor then communicates various health states based on such one or more health metrics via an electrical or mechanical indicator, such as an external LED (light emitting diode).

Before turning to the details of health monitor embodiments of the present invention, exemplary memory system architectures will first be described. FIG. 1 shows an example of memory system 100 in accordance with one embodiment of the present invention. The memory system includes a host interface 102, a memory controller 104, and a memory array in the form of one or more memory array dies, e.g., 106a-106d. An outer casing may be formed around these components so as to provide protection to such components from physical damage. The memory system includes one or more external indicator components, such as LED 122.

Examples of removable memory systems (removable memory units) include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array, along with a controller that controls and supports operation of the memory cell array and interfaces with a host to which the card is connected. Memory card standards include PC Card, CompactFlash™ card (CF™ card), SmartMedia™ card, MultiMediaCard (MMC™), Secure Digital (SD) card, a miniSD™ card, microSD™ card, Memory Stick™, Memory Stick Duo card and microSD/TransFlash™ memory module standards, by way of a few examples. There are several USB flash drive products commercially available from SanDisk Corporation of Milpitas, Calif. under its trademark "Cruzer®." Other examples of removable memory units include Solid State Drives (SSDs), e.g. using SATA, PCIe, ExpressCard or similar standards. SSDs use solid state memory systems in applications where Hard Disk Drives have traditionally been used, such as in laptop computers.

The memory controller 104 is in communication with a host interface 102 that provides a connection to a host 101, which is, for example, a digital camera, laptop computer, MP3 player, PDA, or other similar electronic device. In certain implementations, the host interface 102 complies with a standard (such as a memory card standard or the USB standard) so that the memory system can interface with a wide range of hosts that have a corresponding interface. Typically, such standards provide for the physical arrangement of pins in the physical interface as well as the assignment of each pin, voltage levels used, as well as the protocols used for data and commands sent through the interface. Many interfaces include a provision for a host to provide power to a memory system. For example, memory cards and USB flash drives can obtain their power from a host through such a host interface. Memory controller 104 also includes host interface 108, which is connected to the host interface 102 of the memory system 100.

The memory controller 104 is also in communication with four memory array chips 106a-106d over memory buses 114a and 114b. In the illustrated example, the controller 104 also includes a plurality of memory interfaces, such as Flash Interface Module (FIMs) 110a and 110b. Each FIM is coupled with a different memory bus that is coupled to a different set of memory dies. For instance, FIM 110a is coupled with memory dies 106a and 106b via memory bus 114a, and FIM 110b is coupled with memory dies 106c and 106d via memory bus 114b. Alternatively, a single memory interface may be used for all memory dies 106a-106d.

The arrangement of FIG. 1 may facilitate higher speed access to the memory array by allowing a higher degree of parallelism. Both FIM's may transfer data in parallel to different sets of memory dies, thus doubling the speed of transfer for a given bus size. In one example, each memory bus has a bus width of 16 bits, so that using two such busses in parallel provides the equivalent of a 32 bit wide bus, but without requiring memory chips that are designed for 32 bit access (i.e. cheaper memory chips with 16 bit access may be used). Additionally, a higher degree of parallelism may be achieved due to a higher level of concurrency of operations being executed within the different memory dies, planes, etc.

The memory controller 104 may also be configured to manage data in the memory array. When a host sends data, the memory controller 104 can be operable to determine where the data is to be stored and record the location where such data is stored. In one example, the memory controller performs logical-to-physical mapping so that data received from the host with logical addresses is mapped to physical locations in the memory array in a manner that is determined by the memory controller according to the available space in the memory array.

The memory controller 104 may also include one or more Error Correction Code (ECC) modules, e.g., 118. Host data can be transferred between the memory controller and the flash memory array via FIMs 110a and 110b, which temporarily store such data in buffer RAM 120. A FIM can be configured to detect data errors on the fly during this process. If no errors are detected, the data can be transferred to the host via host interface modules 108 and 102. If errors are detected, ECC circuit 118 could be utilized to correct such errors before transferring the data to the host. Such ECC functions allow errors in data that are read from the memory array 106 to be corrected in the memory controller 104 before the data is sent to the host 101. In certain embodiments, the controller 104 may include any suitable number of ECC modules for writing and reading data to and from the memory array via one or more of the FIMs. That is, each FIM may have its own ECC module, or a single ECC module (118, as shown) may interface with a plurality of FIMs.

The memory controller 104 can take the form of any combination of hardware and software, such as a dedicated chip or Application Specific Integrated Circuit ("ASIC"), which is separate from the nonvolatile memory chips. The memory controller 104 may also include any number and type of circuits for performing the various functions of the controller. For instance, the controller 104 may also include one or more microprocessors 116 and buffer RAM 120. A microprocessor 116 can be configured to provide overall control of the ECC circuit 118, host interface module 108, and flash interface modules 110a and 110b, as well as other components of memory controller 104. The buffer RAM 120 may provide temporary storage of data that is being transferred between the host 101 and memory array, as well as other data for operation of the controller 104.

The memory array may take the form of a nonvolatile NAND flash memory array. Alternatively, the nonvolatile memory array may take the form of one-time-programmable (OTP) memory, NOR flash memory, Magnetic Random Access Memory (MRAM), or other form of nonvolatile memory. The nonvolatile memory array may be located in a plurality of chips as shown. Each chip may include read and write circuits and other peripheral circuits.

Alternative memory systems may include any suitable number and type of controllers, interfaces, buses, and/or memory dies. Several memory system architectures are described in U.S. patent application Ser. No. 13/167,929, entitled "Controller, Storage Device, and Method for Power Throttling Memory Operations", filed Jun. 24, 2011, by Paul A. Lassa et al., which application is incorporated herein by reference in its entirety for all purposes.

The memory controller also includes a health monitor 112. The health monitor embodiments of the present invention may be integrated into any type of memory system architectures, such as the architectures described herein, including descriptions incorporated herein. Overall, a health monitor may be implemented by any suitable combination of hardware and/or software. Although the embodiments illustrated herein show the health monitor as being part of the memory controller, the health monitor can be a separate module from the controller or formed within any suitable logic block of the memory system.

FIG. 2 is a table that illustrates utilization of plurality of health status modes in accordance with one embodiment of the present invention. Generally, a plurality of health metrics may be monitored and then associated with different health status modes, which may be communicated to the host as described herein. Any suitable data structure or memory may be used to store information for monitoring health metrics, such as the information in the table of FIG. 2.

In the illustrated example, the monitored health metric takes the form of a hot count for each memory block. Hot count can refer to the number of erase and write cycles for each memory block that is erased together. In one particular embodiment, each memory array may be divided into a large number of BLOCKS 0-N of memory cells. In one embodiment, a block is a unit of erase or the minimum number of memory cells that are erased together. That is, all of the erase gates of each memory block are connected together for simultaneous erasure when appropriately addressed. Each block can also be divided into a number of pages. A page is the minimum unit of programming, and one or more sectors of user data are typically stored within each page. A sector is the smallest unit of logical data that the host will address or transfer to or from the non-volatile memory. In disk drive applications, a sector is typically 512 bytes. Some non-volatile memories allow partial page programming in which the individual bits remaining in an erased state after a first programming can be programmed in subsequent page program operations without first erasing the page. Some multistate memories may even allow bits already programmed in a lower programmed state to be programmed into a higher state in subsequent page program operations. In these memories, sectors or even portions of sectors may be programmed at different times. Nevertheless, although one page remains the basic unit of programming, some bits may be masked out and programmed later.

A hot count value can be stored and associated with each block. Alternatively, hot counts for each block may be kept in a separate portion of the memory from the corresponding data block and may be stored with a block identifier. Regardless of location, each hot count value can be incremented when the corresponding block is erased and rewritten. In one implementation, each block may be associated with a header that includes a field to maintain a count of the number of times that the block has been erased and rewritten. As part of an erasure and rewrite cycle, this count is updated by one. The header, including the cycle count field, remains with its physical block. Thus, even when data is swapped among memory blocks, for example, in order to accomplish wear leveling, it is the data stored in the portion of each block that is swapped, and not the count. The hot count associated with each block may then be read and processed periodically through-out the lifetime of the memory in order to determine whether hot count thresholds have been reached for each block.

Besides hot count, other example health metrics may include error rate or count, percentage of memory use, hot counts for number of times data for each logical address has been moved from a physical address to another physical address, average hot counts for all the memory cells, read disturb (read count within same physical block), etc. One or more health metrics can be stored with their corresponding data blocks, pages, or within any portion of the non-volatile memory array or any other suitable memory of the removable storage device.

Referring back to FIG. 2, different ranges of the hot count values correspond to different health status, different actions, and different outputs to an external indicator (e.g., LED) of the memory device. These ranges are delimited by threshold values for either MLC (multi-level-cell) type devices or SLC (single-level cell) type devices. As shown, three ranges correspond to three modes: a RW (read write) mode, a transition mode, and a RO (read only) mode. In this specific implementation, these three different modes result in different LED behavior. As shown, the RW mode results in the LED breathing slowly (fading on and off); the transition mode results in the LED blinking rapidly; and the RO mode results in the LED being solidly on.

When the hot count value reaches a first threshold (6 for MLC and 600 for SLC) for each cell/block, the memory system transitions from the RW mode to the transition mode. The host is notified via the LED blinking rapidly so as to indicate that the memory system is close to reaching its write limit and transitioning from a RW mode to a RO mode. During this transition mode, the user/host can continue to write, but preferably is finishing his or her write actions.

During this transition mode, different conditions may cause the memory system to go into RO mode, depending on whether relatively higher hot count thresholds are reached. As shown, when the hot count is greater than or equal to 6 for MLC (or 600 for SLC) and less than 9 for MLC (900 for SLC), the memory system merely warns the host/user that the memory system is nearing its write limit. In this embodiment, the memory system merely waits for higher limits to be reached, but in other embodiments the memory system may transition to a read only mode when the host unplugs the memory system or other conditions are met. In the illustrated embodiment if the host continues to write and the hot count then reaches a $2^{nd}$ threshold (9/900), the memory system will convert to RO mode when host is idle for more than 5 seconds (or any other suitable amount of time) or the memory system is unplugged. If the host continues to write so as to increase the hot count above the third threshold (10/1000), the memory system will immediately convert to RO mode, regardless of the card being unplugged or idle. In the RO mode, the memory system outputs a solid "on" state to the LED.

FIG. 3 is a flow chart illustrating a health monitor procedure 300 in accordance with a specific implementation of the present invention. The memory system is removable and can be removed and plugged repeatedly into a host. Thus, the health monitor process can start for either an initial use (the card is plugged in for the first time) or a subsequent use of the removable memory system (the card is removed and plugged in again). After initiation of the memory's first use, a health metric may be initialized (e.g., hot count is zero) and a corresponding health status is initiated to a read or write (RW) mode in operation 302. Of course, the relevant health metric (e.g., hot count for each block) may be preconfigured to an initial value (e.g., 0) and the RW mode preconfigured in a new removable device. Regardless of how it's set, this RW mode status is also output via an external LED or any other electrical or mechanical device when the memory device is first used in operation 302. If this is not the first use, the last saved health status may be output via the LED after initiation of a subsequent memory use in operation 304. For instance, if the memory device has moved into a transition mode and such device is removed and plugged back into the host, the transition mode status is output via the external indicator.

Other types of external indicators of health status may be implemented. That is, any visual or audible mechanism may be utilized. Examples of visual indicators include one or more of the following: multi-color backlights, LCD panel, multi-color LED, multiple LEDs, etc. Examples of audible indicators include piezo-ceramic transducers, electro-magnetic type alarms, etc. A plurality of different health modes may be output as any combination of different frequencies of blinking, different frequencies of breathing on and off, different colors, alphanumeric symbols, different tones, different sound types, different sound frequencies, etc.

The health status may be output to the external device to cause such external device to visually or audible function differently for different health status modes. In the LED example, a 1 or a 0 signal is output to cause the LED to turn on and off, respectively. The signal can be alternated between 1 and 0 to cause the LED to blink or breath at different rates. Other external devices can be similarly controlled.

After the current health status is output, it may then be determined whether the health metric has reached a first predefined threshold in operation 306. The determination for whether a health metric has reached a threshold may be accomplished in any suitable manner. For instance, the maximum number of hot counts for all physical blocks may be tracked and it may then be determined whether the maximum hot count for each block has reached a particular threshold. A memory system is typically configured to perform wear leveling so that erase cycles are evenly performed on the entire set of blocks. For instance, if a threshold is 6 hot counts (e.g., for MLC) and the memory device includes y number of blocks, even when 1 block has hot count 6 while the other y−1 blocks have hot count less than 6, it can be determined that the threshold is reached. Tracking the maximum hot count instead of the average hot count can work to ensure the worst case data retention. Accordingly, the wear leveling can be used for the memory system so that all blocks could be evenly performed and utilized.

If the first threshold has not been reached, it may then be determined whether a power cycle has commenced in operation 308. For example, it may be determined whether the user has initiated an ejection of the card or the card is being unplugged from the host. If a power cycle has commenced, the procedure 300 ends. Otherwise, the process may continue to check whether the health metric has reached the first predefined threshold in operation 306.

When this first threshold is reached, it may then be determined whether the health metric has reached a second predefined threshold in operation 310. If this second threshold has not been reached (merely the first threshold has been reached), the health status for indicating that the memory is close to a write cycle limit and will soon convert to RO mode is output to the external indicator in operation 312.

The process may then wait for the second predefined threshold to be reached in operation 310. If the second predefined threshold is then reached, it may then first be determined whether the health metric has also reached a third predefined threshold in operation 316. If this third predefined threshold has not been reached (only the second threshold has been reached), it may then be determined whether idle time is greater than five seconds or a power cycle has commenced in operation 318. If these conditions are not met, the process continues to wait until the third predefined threshold is met or these conditions are met.

After the third predefined threshold is met, the health status automatically is set to RO mode and an indication of the RO mode is output via the LED in operation 320. The power cycle may also complete in operation 320. When the health metric reaches a critical limit, the memory system automatically goes into RO mode and the user is informed via the external indicator (e.g., LED goes solid on).

Although the above process includes assessment of a single health metric, a combination of multiple health metric values may be assessed to determine what status to output and/or actions to take. For instance, a combination of error rate and hot count thresholds may be tied to different health state modes and corresponding actions. Additionally, although only certain conditions are described to transition the memory system into a RO mode, other conditions may also be used. For example, a different idle limit, besides 5 seconds, may be used.

The health monitor may be configured to transition automatically into RO mode based on any suitable condition being met, for example, as described above. Additionally, a selectable option may be provided to the user to keep the memory system in RW mode, regardless of health. If the user chooses to maintain the device in RW mode, the health monitor may also be configured to communicate to the host that the memory system is no longer guaranteed to retain data as the device would otherwise if the device were kept in RO mode. For example, a data retention warranty of 100 years may be voided upon converting (or keeping) the device in RW mode.

An option to keep the memory system in RW mode, even when a RO mode conversion has occurred or is imminent, may be provided to the host in any suitable manner. In one embodiment, the host is configured with software to provide a GUI (graphical user interface) when the memory device warns the user that the write limit is near or when the user is made aware that the device is converting to a RO mode (or already has converted to a RO mode). In another embodiment, a GUI may simply be provided so as to simply notify the user that the memory device has converted to RO mode, without the GUI providing an option to go back to a RW mode.

Figure 4:
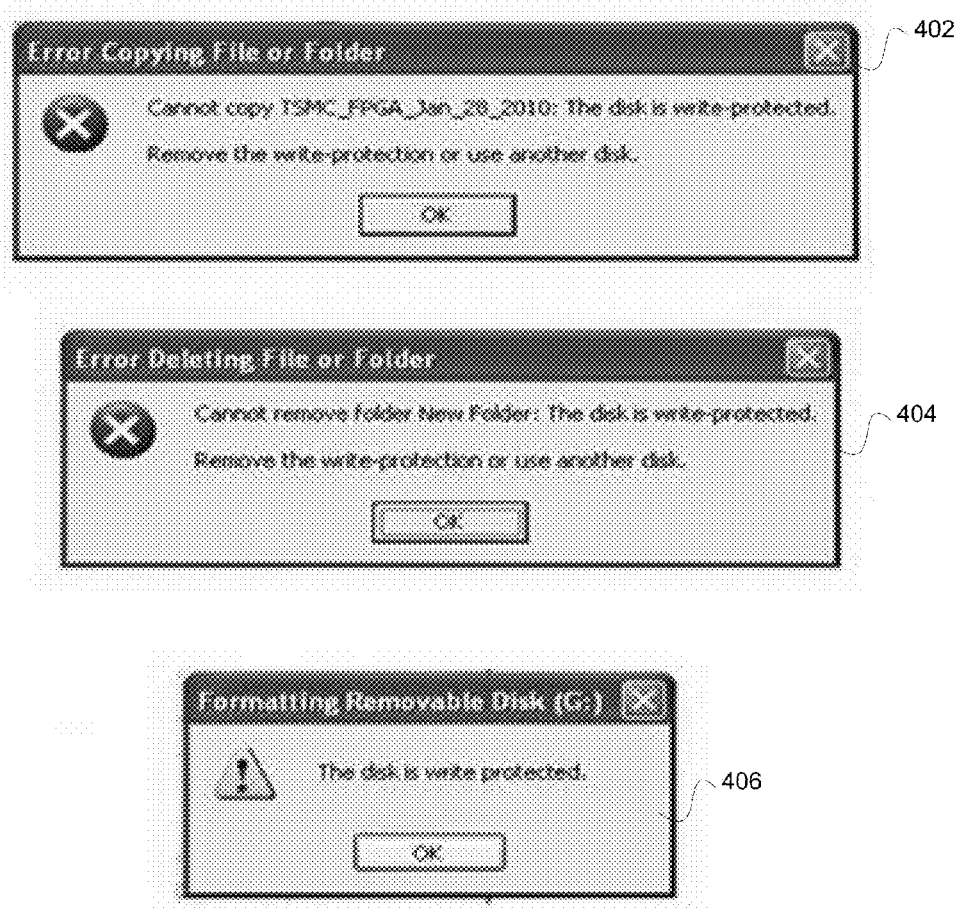
FIG. 4 illustrates different GUI's that may be presented to a user of a host that is coupled to a write protected, removable memory system in accordance with three examples.

FIG. 4 illustrates different GUI's that may be presented to a user of a host that is coupled to a write protected, removable memory system in accordance with three examples. As shown, a first error GUI 402 may be presented when the user attempts to copy a file or folder on a RO mode device. A second error GUI 404 may also be presented when the user attempts to delete a file or folder from a RO mode device. A third GUI 406 may also be presented when the user attempts to format a RO mode device. In all three cases, the user is notified that the device is write-protected. In one or more of these examples, the user may select an "OK" button and then be presented with a second GUI (not shown) to allow selection of RW mode while being notified that the data retention warranty will be void if the RW mode is selected. Selection of a RW mode may take any suitable form, such as a check box, pull-down function, etc.

Figure 5:
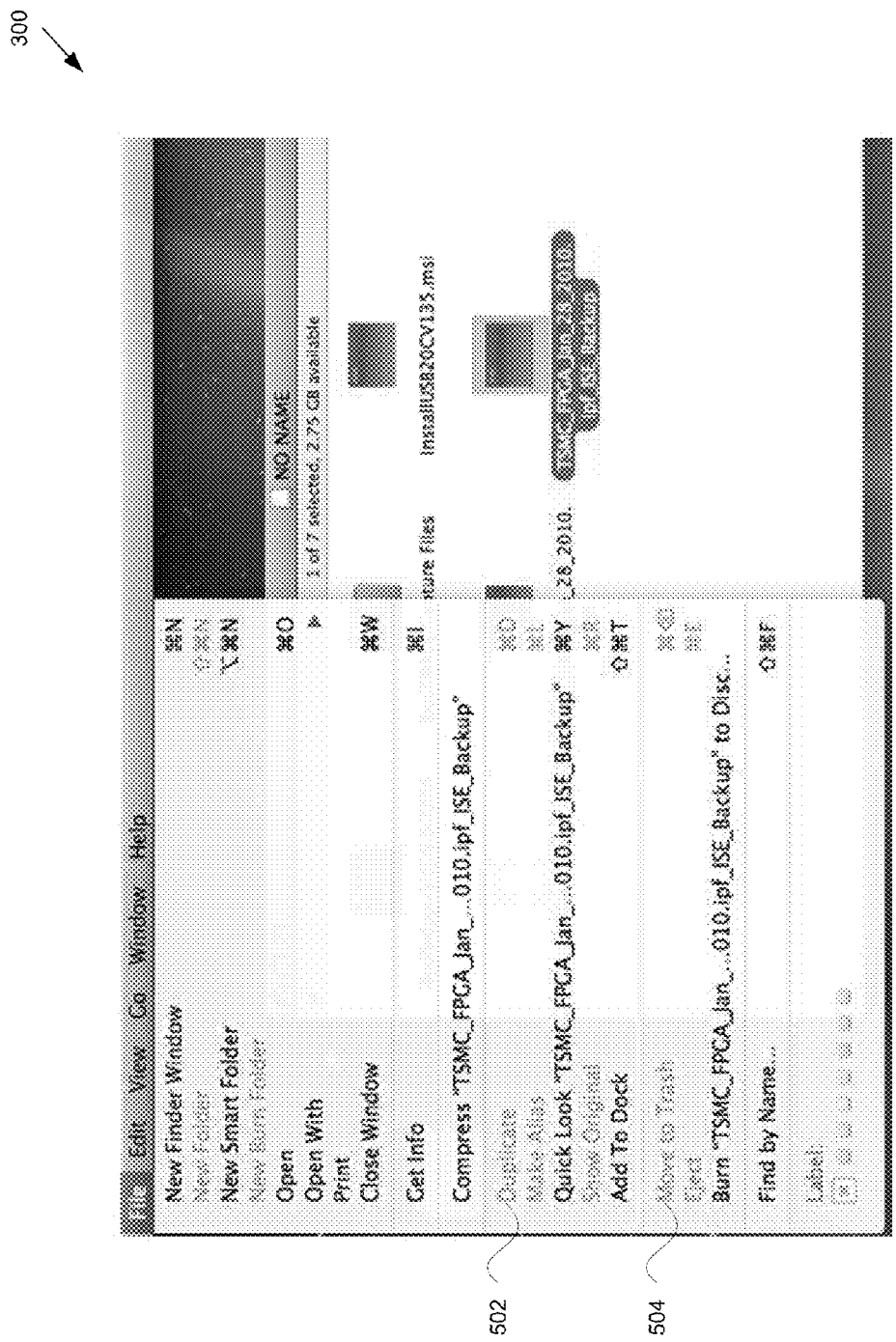
FIG. 5 illustrates a GUI that is presented with the delete and copy functions disabled on a Mac PC during a write-protected mode in accordance with one example embodiment.

FIG. 5 illustrates a GUI that is presented with the delete and copy functions disabled on a Mac PC during a write-protected mode in accordance with one example embodiment. As shown, the "duplicate" feature 502 and the "delete" feature 504 are inactive and cannot be selected for the particular RO mode memory device. In this example, there is no option to convert the device back to RW mode. However, such an option may be added in the pull-down menu or other input mechanism to perform this function.

Figure 6:
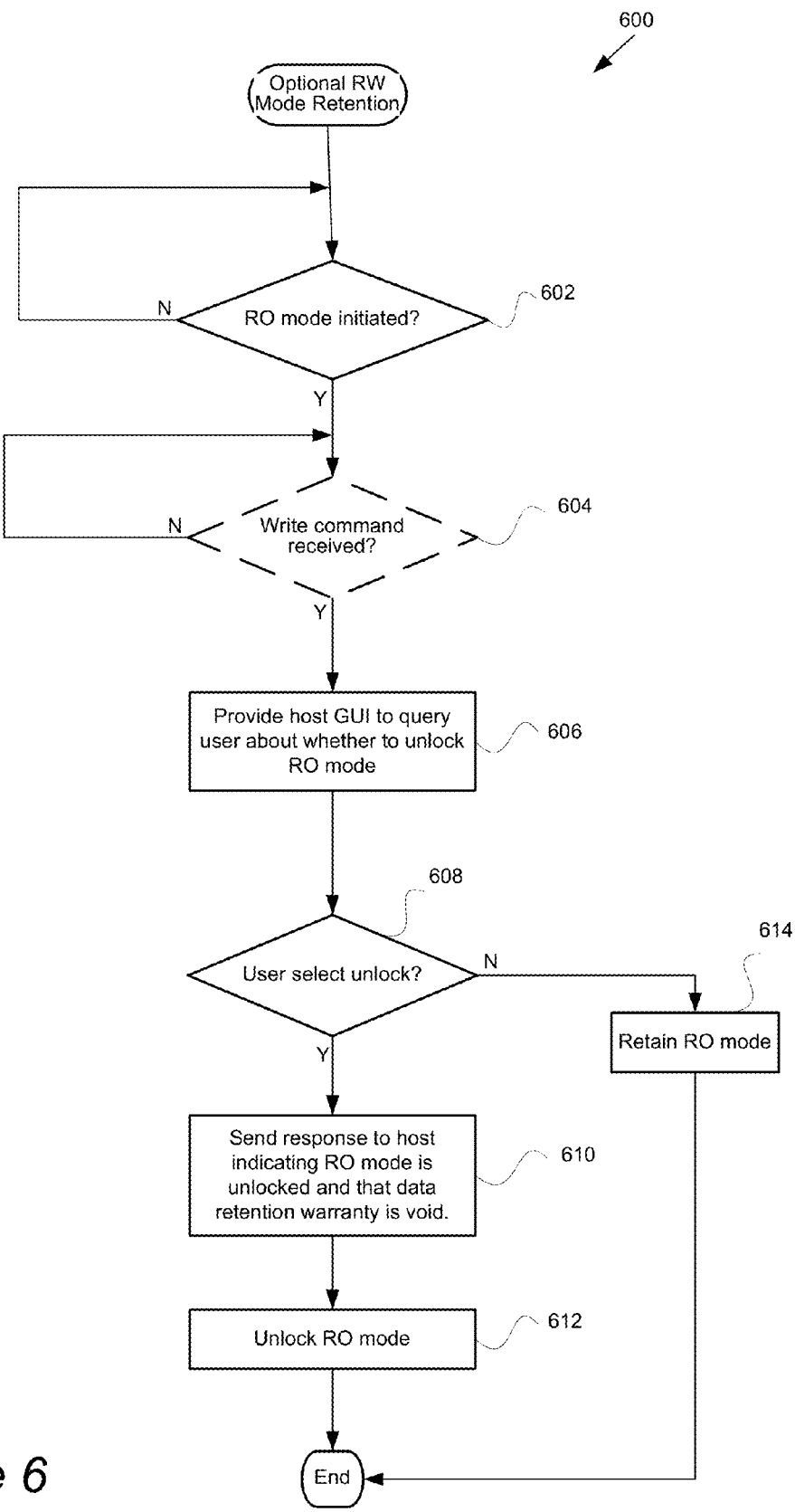
FIG. 6 is a flow chart illustrating a procedure for disabling or inhibiting a read only mode in accordance with one embodiment to the present invention

FIG. 6 is a flow chart illustrating a procedure 600 for disabling or inhibiting a RO mode in accordance with one embodiment to the present invention. Initially, it is determined whether a RO mode has been initiated in operation 602. For example, the RO mode is initiated by the memory system based on conditions as previously described with respect to FIG. 3. If RO mode has not been initiated, the process 600 may wait.

If the RO mode has been initiated, it may then be determined whether a write command (e.g., duplicate, delete, or reformat) has been received from the host in operation 604. When a write command has been received, a host GUI may then be provided to query the user about whether to unlock the RO mode in operation 606. Alternatively, this operation 604 for determining whether there is a write command is optional and the user is simply sent a query after the device goes into RO mode. The query may take any suitable form, such as a one or more pop-up window, graphic, etc. The query may include notification that the device has been converted to RO mode (or will soon convert to RO mode), in addition to giving the user an option to keep the device from being in RO mode.

After the user is presented with a query, the process 600 may then include determining whether the user has selected an unlock feature in operation 608. If an unlock feature has not been selected, the RO mode is retained in operation 614. The procedure for giving an option to void the RO mode is then complete.

If the user selects the unlock function (e.g., through the host's GUI), a response may be sent to the host indicating that RO mode has been unlocked and that data retention warranty is void in operation 610. The RO mode may then be unlocked in operation 612, or this step may occur prior to notifying the user. The unlock procedure may then end.

Certain embodiments of the present invention can provide a simple mechanism to alert a host/user when a write limit of a removable device and conversion to a RO mode is imminent. The host is not required to be configured with separate software to be notified of such RO mode although a simple GUI can be additionally provided for some host operating systems. Instead, an intelligent LED can be utilized on the memory device itself. Accordingly, the notification mechanism for informing the user of different states in health (e.g., blinking or breathing or solid) can be kept simple while allowing the user to recognize the health status of the storage device.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method for indicating health of a removable memory system that is removably coupled with a host device, the method comprising:
after the memory system is coupled with a host device, outputting a first health status via an external electrical or mechanical interface of the memory system;
monitoring one or more health metrics of the memory system;
after a first predefined limit is reached with respect to the one or more health metrics, outputting a second health status via the external electrical or mechanical interface of the memory system, wherein the first health status differs from the second health status, and wherein the first predefined limit is a first programming or erase count limit and the second health status indicates that the memory system is close to its maximum programming or erase count limit for allowing programming operations from the host to the memory system to continue; and after a second predefined limit is reached with respect to the one or more health metrics, converting the memory system to read only mode after the memory system is decoupled from the host device or the host device remains idle for more than a predefined time duration.

2. The method of claim 1, wherein the first health status indicates that the host device is allowed to perform data operations, including programming operations, with respect to the memory system.

3. The method of claim 1, further comprising:

after a third predefined limit is reached with respect to the one or more health metrics, outputting a third health status via the external electrical or mechanical interface of the memory system and converting the memory system to read only mode even if the memory system remains coupled with the host device, wherein the second predefined limit is a second programming or erase count limit that is higher than the first programming or erase count limit and the third predefined count limit is a third programming or erase count limit that is higher than the second programming or erase count limit, wherein the third health status differs from the first and second health status, and wherein the third health status indicates that the memory system has reached the end of its programming life.

4. The method of claim 3, wherein the memory system is converted to read only mode after the third predefined limit is reached, even if the host device remains idle for more than a predefined duration of time or the host device is active.

5. The method of claim 4, wherein the electrical or mechanical interface is a light device, and the first health status causes the light device to breath slowly, the second health status causes the light device to blink rapidly, and the third health status causes the light device to remain on.

6. The method of claim 3, further comprising:

querying the host device as to whether the memory system is to be converted into read only mode; and if the host device indicates that the memory system is not to be converted into read only mode, stopping the memory system from being converted to read only mode or converting the memory system back to a programming mode.

7. The method of claim 6, further comprising:

informing the host device that if the memory system is not to be converted to read only mode, data retention of a predefined maximum time duration cannot be guaranteed.

8. The method of claim 1, wherein the one or more health metrics comprise one or more of the following: a hot count metric, an error rate metric, or read disturb.

9. A method for indicating health of a removable memory system, the method comprising:

after the memory system is coupled with a host device, outputting from the memory system a first externally visible or audible health indicator that indicates that the memory system is programmable by the host device;

tracking a hot count for performing an erase cycle on each memory cell block of the memory system to determine whether the hot count has reached one of a plurality of hot count thresholds;

if the hot count reaches a first one of the hot count thresholds, outputting from the memory system a second externally visible or audible health indicator that indicates that the memory system is about to be converted to a read only mode; and if the hot count reaches a second one of the hot count thresholds, outputting from the memory system a third externally visible or audible health indicator that indicates that the memory system is being immediately converted to a read only mode.

10. A memory system that is removably couplable with a host device, the memory system comprising:

an external electrical or mechanical interface coupled with a controller;

a nonvolatile memory array for storing data and coupled with the controller; and the controller operable to perform the following operations:

after the memory system is coupled with a host device, outputting a first health status via the external electrical or mechanical interface of the memory system;

monitoring one or more health metrics of the memory system;

after a first predefined limit is reached with respect to the one or more health metrics, outputting a second health status via the external electrical or mechanical interface of the memory system, wherein the first health status differs from the second health status, and wherein the first predefined limit is a first programming or erase count limit and the second health status indicates that the memory system is close to its maximum programming or erase count limit for allowing programming operations from the host to the memory system to continue; and after a second predefined limit is reached with respect to the one or more health metrics, converting the memory system to read only mode after the memory system is decoupled from the host device or the host device remains idle for more than a predefined time duration.

11. The memory system of claim 9, wherein the first health status indicates that the host device is allowed to perform data operations, including programming operations, with respect to the memory system.

12. The method of claim 10, the controller further operable to perform the following operations:

after a third predefined limit is reached with respect to the one or more health metrics, outputting a third health status via the external electrical or mechanical interface of the memory system and converting the memory system to read only mode even if the memory system remains coupled with the host device, wherein the second predefined limit is a second programming or erase count limit that is higher than the first programming or erase count limit and the third predefined count limit is a third programming or erase count limit that is higher than the second programming or erase count limit, wherein the third health status differs from the first and second health status, and wherein the third health status indicates that the memory system has reached the end of its programming life.

13. The memory system of claim 12, wherein the memory system is converted to read only mode after the third predefined limit is reached, even if the host device remains idle for more than a predefined duration of time or the host device is active.

14. The memory system of claim 13, wherein the electrical or mechanical interface is a light device, and the first health status causes the light device to breath slowly, the second health status causes the light device to blink rapidly, and the third health status causes the light device to remain on.

15. The memory system of claim 12, the controller further operable to perform the following operations:
   querying the host device as to whether the memory system is to be converted into read only mode; and
   if the host device indicates that the memory system is not to be converted into read only mode, stopping the memory system from being converted to read only mode or converting the memory system back to a programming mode.

16. The memory system of claim 15, the controller further operable to perform the following operations:
   informing the host device that if the memory system is not to be converted to read only mode, data retention of a predefined maximum time duration cannot be guaranteed.

17. The memory system of claim 10, wherein the one or more health metrics comprise one or more of the following: a hot count metric, an error rate metric, or read disturb.

* * * * *